United States Patent [19]

Yagi

[11] Patent Number: 4,684,093
[45] Date of Patent: Aug. 4, 1987

[54] FIXATION DEVICE FOR ELECTRONIC DISPLAY

[75] Inventor: Masaru Yagi, Tsushima, Japan

[73] Assignee: Kitagawa Industries Co., Ltd., Nagoya, Japan

[21] Appl. No.: 857,260

[22] Filed: Apr. 30, 1986

[30] Foreign Application Priority Data

Jul. 24, 1985 [JP] Japan ............................ 60-114150[U]

[51] Int. Cl.⁴ .............................................. F16M 11/00
[52] U.S. Cl. ...................................... 248/201; 24/543; 248/27.1
[58] Field of Search ............... 248/201, 71, 73, 316.5, 248/316.7, 500, 27.1, 74.1; 24/543, 518, 47, 453, 297, 697; 339/17 CF

[56] References Cited

U.S. PATENT DOCUMENTS

| | | | |
|---|---|---|---|
| 3,171,184 | 3/1965 | Posse | 24/543 X |
| 3,713,622 | 1/1973 | Dinger | 24/543 X |
| 3,917,202 | 11/1975 | Reinwall et al. | 248/73 X |
| 3,931,946 | 1/1976 | Soltysik | 248/73 X |
| 4,038,726 | 8/1977 | Takabayashi | 24/543 X |
| 4,143,577 | 3/1979 | Eberhardt | 248/71 X |
| 4,356,599 | 11/1982 | Larson et al. | 24/543 X |
| 4,564,163 | 1/1986 | Barnett | 248/71 |

Primary Examiner—Ramon O. Ramirez
Attorney, Agent, or Firm—Oblon, Fisher, Spivak, McClelland & Maier

[57] ABSTRACT

An electronic display fixation device which comprises at least two holding members (4, 5, 41) formed at one of the transverse edges of the plate-like rest (3, 43) so as to pivot via hinges (12, 13) for retaining an electronic display 2, engaging members (14, 15) formed at another transverse edge of the rest as opposed to the hinges (12, 13) for engaging each free end of the holding members (4, 5, 41) at the position where the abovementioned electronic display is retained by the holding members, and fixing members (7, 8) extending from the back surface of the plate-like rest for fixing the rest on the circuit board.

10 Claims, 13 Drawing Figures

FIXATION DEVICE FOR ELECTRONIC DISPLAY

BACKGROUND OF THE INVENTION

1. Technical Field

The present invention relates to a fixation device for an electronic display, particularly to a device for fixing an electronic display on a printed circuit board of electronic apparatuses with high stability by a simple attaching operation.

2. Prior Art

An electronic display such as a liquid-crystal or flourescent display tube for digitally or graphically showing a volume of sound, frequency, revolution speed, time measurement result or the like is attached to a home electric appliances such as television set, radio, video tape recorder, microwave oven, stereo, and measuring instrument. Although various means for installing electronic display parts into electronic apparatuses have been proposed, each of the means includes some problems, e.g., lack of positioning stability, complicated processes for attachment and demounting, all of which result in inefficiency in respect to the production of electronic apparatuses.

Recently, however, several inventions have been made for providing an electronic display fixation device which enables a display to be stably attached to and easily demounted from an electronic apparatus. One of this type is the fixation device 50 illustrated in FIGS. 11 thru 13 and disclosed in U.S. patent application Ser. No. 815,470. As shown in the figures, the fixation device 50 has a terminal holding frame 54 to help attachment of an electronic display tube 52 with a number of terminals 51 to the circuit board 53 with various electronic parts, a fixing member 55 for fixing the body of fixation device 50 on the circuit board 53, and holding members 56 for retaining the electronic display tube 52 at both longitudinal edges of the fixation device 50.

In the above-mentioned conventional fixation device 50, the holding members 56 are formed at both longitudinal edges of the fixation device 50 so as to pivot via hinges 57. Moreover, engaging members are composed of projections 58 and pawls 59 which are respectively formed at transverse ends of the fixation device 50 and the holding members 56 for fixing the holding members 56 at the position where the electronic display tube 52 is retained by the holding members. Therefore, the electronic display tube 52 can be accurately fixed on the circuit board 53 by putting the fixation device 50 on the circuit board 53, setting the electronic display tube 52 on the above-mentioned fixation device 50, then pivotally turning the holding members 56 in the direction of arrowhead A in FIG. 12, and engaging the projections 58 and pawls 59 as shown in FIG. 13. However, when the electronic display tube 52 is attached to or demounted from the fixation device 50, it is required to simultaneously engage or disengage the above-mentioned engaging members, which is troublesome. If only one of the engaging members of the holding member 56 is released and turned outwards for demounting the display tube, the body of holding member 56 is bent or sometimes broken.

SUMMARY OF THE INVENTION

The first object of the present invention is to provide a fixation device with only one pair of engaging members which realizes easy attachment and demounting of an electronic display tube by a simple operation.

The second object is to provide a fixation device which can easily and stably fix the electronic display by putting the electronic display on the plate-like rest, then pivotally turning the holding member so as to connect their free ends and the engaging members, and fixing the plate-like rest on the circuit board. The operation for demounting the display is also simple.

The third object of the present invention is to provide a fixation device with a pair of engaging members for engaging the free ends of the holding members by a simple operation, while the conventional one required two pairs of engaging members for one holding member. Thereby the operational efficiency can be improved.

The present invention has the following construction for solving the problems found in the conventional fixation device. The construction is such that a fixation device includes holding members formed at one of the transverse end surfaces of the plate-like rest so as to be pivotally movable via hinges for retaining an electronic display on the rest, a pair of engaging members formed at another transverse end of the rest as opposed to the hinges for engaging each free end of the holding members at the position where the display is retained by the holding members, and fixing members formed on the back surface of the plate-like rest for fixing the rest on the circuit board.

As described hereinbefore, the electronic display fixation device of the present invention can easily fix the electronic display on the platelike rest by setting the display on the rest, then pivotally turning the holding member, and simply connecting each free end of the holding members with the engaging members. The most remarkable feature of this invention is that only a pair of engaging members is utilized to fix the electronic display, thereby the operations of attachment and demounting are simplified.

DETAIL DESCRIPTION OF PREFERRED EMBODIMENT

Figure 1:
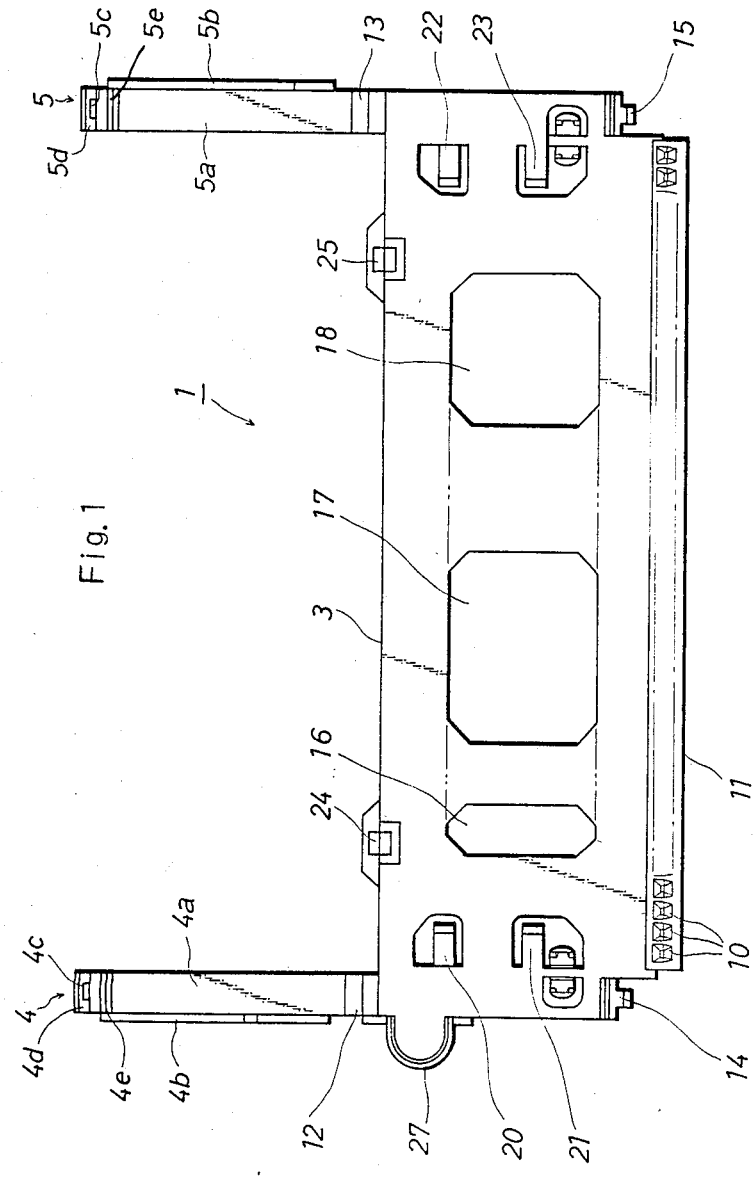
FIG. 1 is a plan view of a fixation device of the present embodiment.

The embodiment of the present invention is hereinafter described in detail referring to the drawings. In this embodiment, a fixation device for fixing an electronic display tube is employed for an example.

Figure 2:
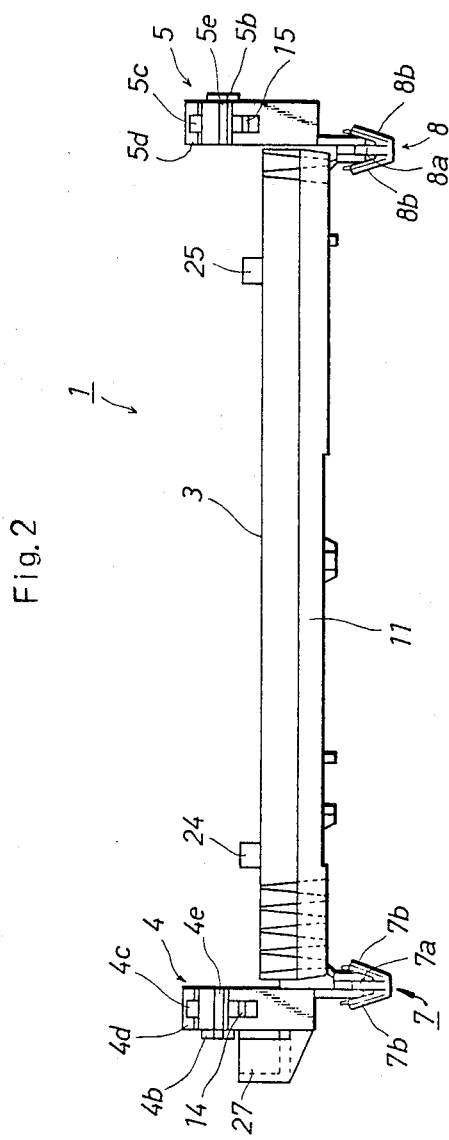
FIGS. 2, 3 and 4 are respectively illustrative of a front view, a bottom view and a back view of the fixation device of this embodiment.
Figure 3:
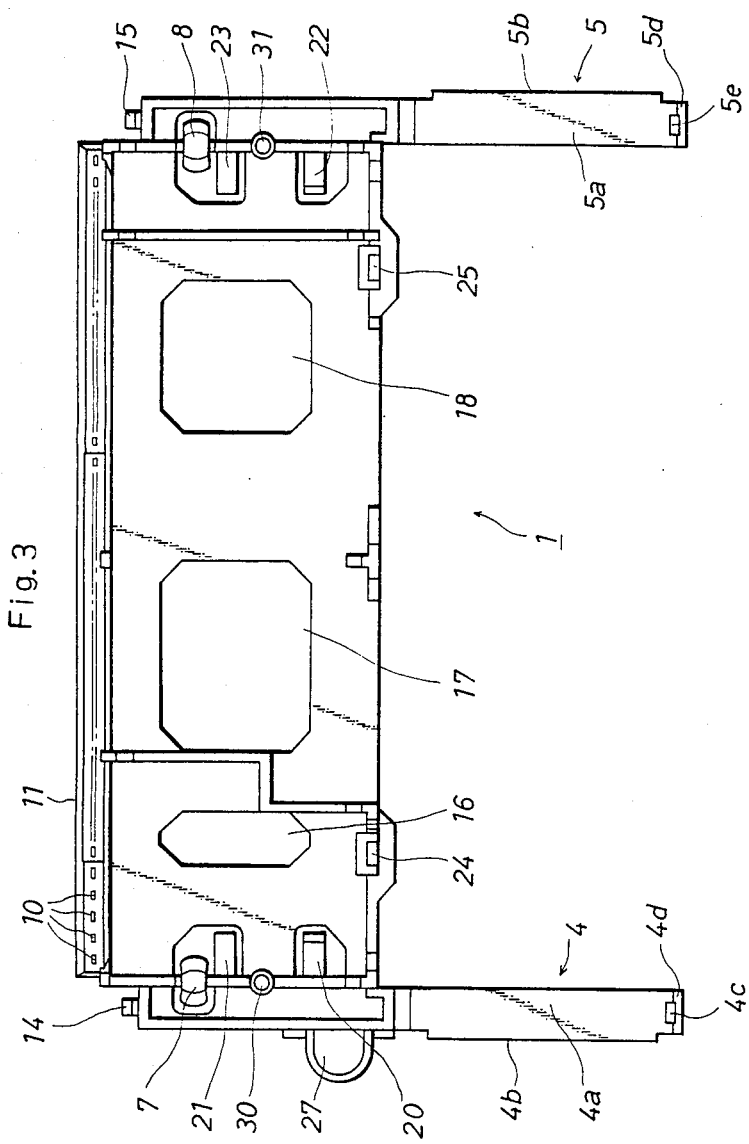
Figure 4:
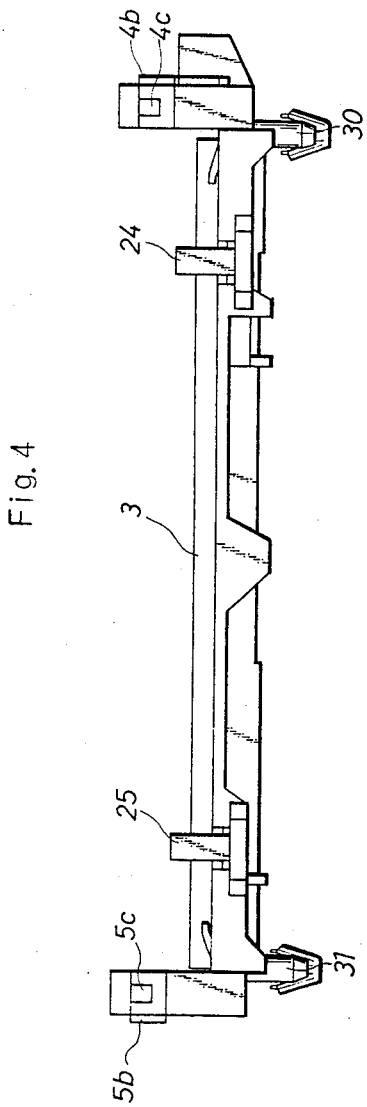

FIG. 1 shows a plan view of a fixation device of the present embodiment. FIGS. 2, 3 and 4 are respectively illustrative of a front view, a bottom view, and a back view of the fixation device of this embodiment.

Figure 5:
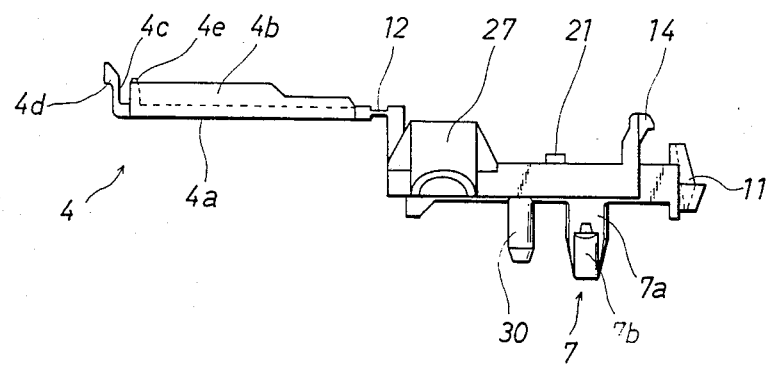
FIG. 5 denotes a left-hand side view of the fixation device.
Figure 6:
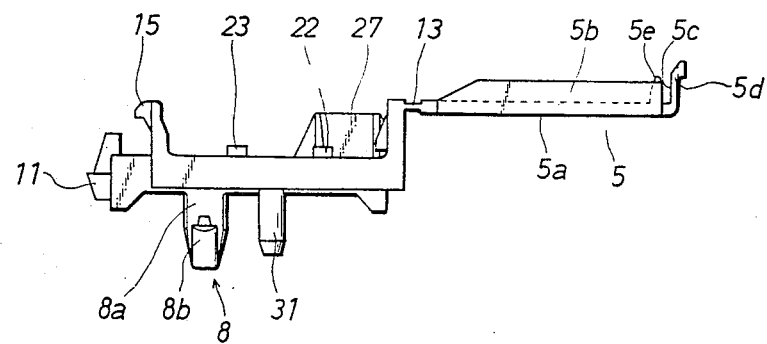
FIG. 6 shows a right-hand side view of the fixation device.
Figure 7:
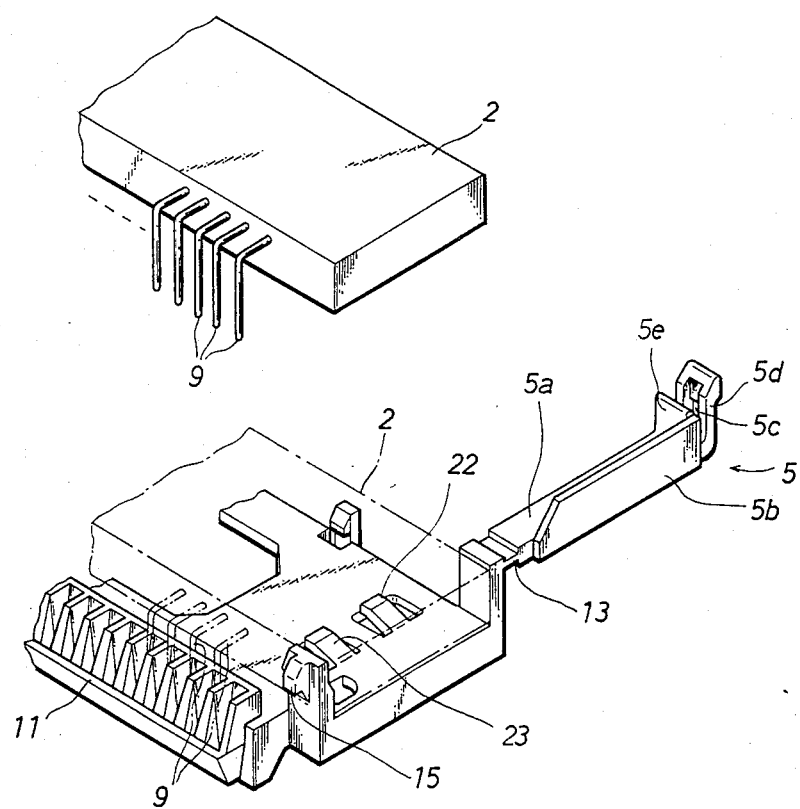
FIG. 7 is a partially cut-away view in perspective of a fixation device and an electronic display tube.
Figure 8:
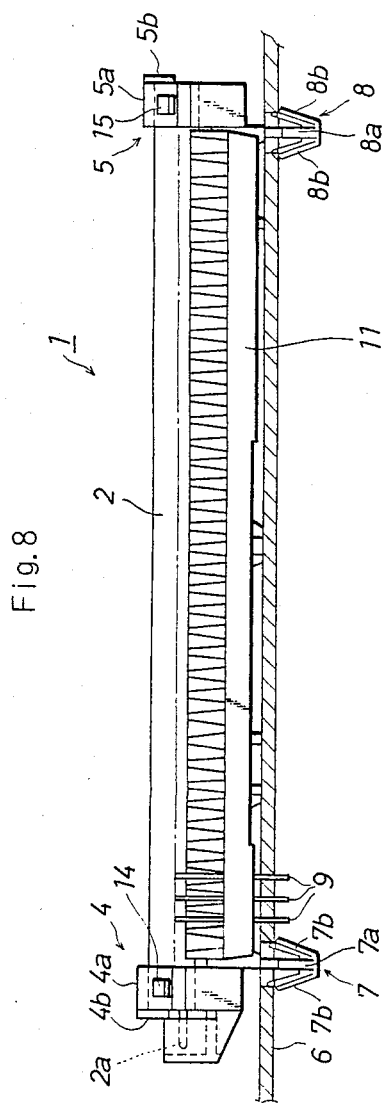
FIG. 8 is a front view illustrative of a condition that an electronic display tube is fixed on a circuit board.
Figure 9:
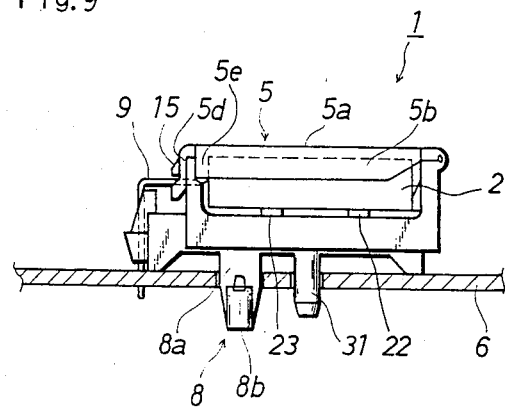
FIG. 9 shows a right-hand side view of the fixation device in the above-mentioned condition.

FIGS. 5 and 6 illustrate a left-hand side view and a right-hand side view of the fixation device of this embodiment, respectively. FIG. 7 shows a partially cutaway view in perspective of a fixation device and an electronic display tube. FIG. 8 denotes a front view illustrative of a condition that an electronic display tube is fixed on a circuit board. FIG. 9 is a right-hand side view of the fixation device in the abovementioned condition.

As shown in figures, the fixation device 1 of this embodiment includes a plate-like rest 3 to which an electronic display tube 2 is set, holding members 4 and 5 for retaining the electronic display tube 2 at both longitudinal edges of the plate-like rest 3, fixing members 7 and 8 for fixing a plate-like rest 3 on a circuit board 6, and a terminal holding frame 11 with a number of guide grooves 10 for guiding the insertion of many terminals (lead wires) extending from the electronic display tube 2. All of the abovementioned members are integrally formed and they are made of synthetic resin such as a polyamide condensation polymer or a polyester condensation polymer.

The holding members 4 and 5 are formed at one of the transverse ends of the plate-like rest so as to pivot via hinges 12 and 13. When the holding members 4 and 5 are pivotally turned to be closed, the corner surfaces of longitudinal ends of the electronic display tube 2 are engaged by the upper walls 4a and 5a and the side walls 4b and 5b of the holding members. Moreover, engaging projections 14 and 15 are formed on another transverse end of the rest as opposed to the hinges 12 and 13 and the engaging parts 4d and 5d with insertion holes 4c and 5c are formed at each free end of the holding members 4 and 5. In addition, projecting parts 4e and 5e are also formed at holding members 4 and 5 respectively as opposed to the engaging parts 4d and 5d. When the engaging projections 14 and 15 of the plate-like rest 3 are inserted into the insertion holes 4c and 5c, the holding members are firmly engaged with the plate-like rest so as not to be easily disengaged.

Figure 11:
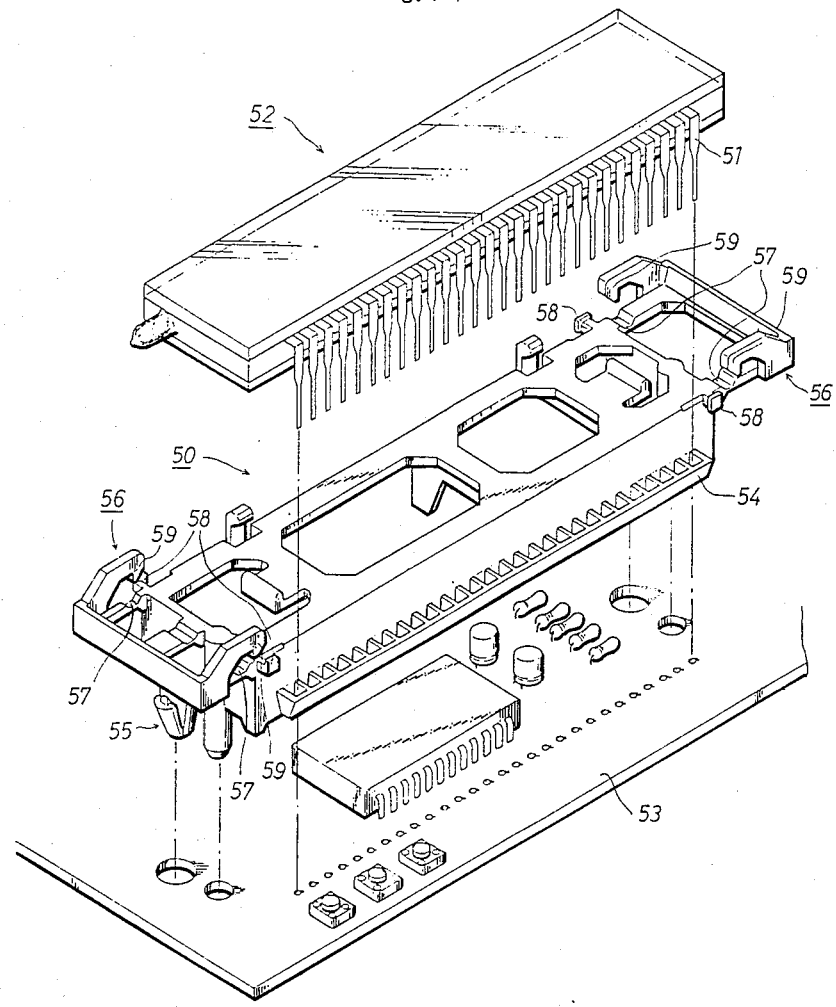
FIGS. 11 thru 13 illustrate perspective views of the prior art.
Figure 12:
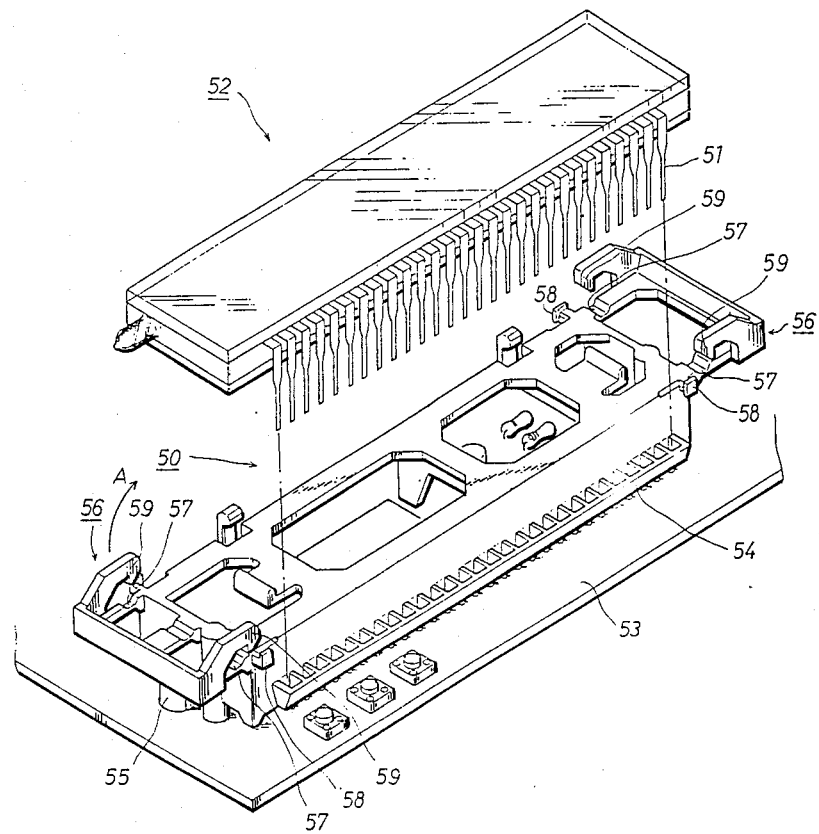
Figure 13:
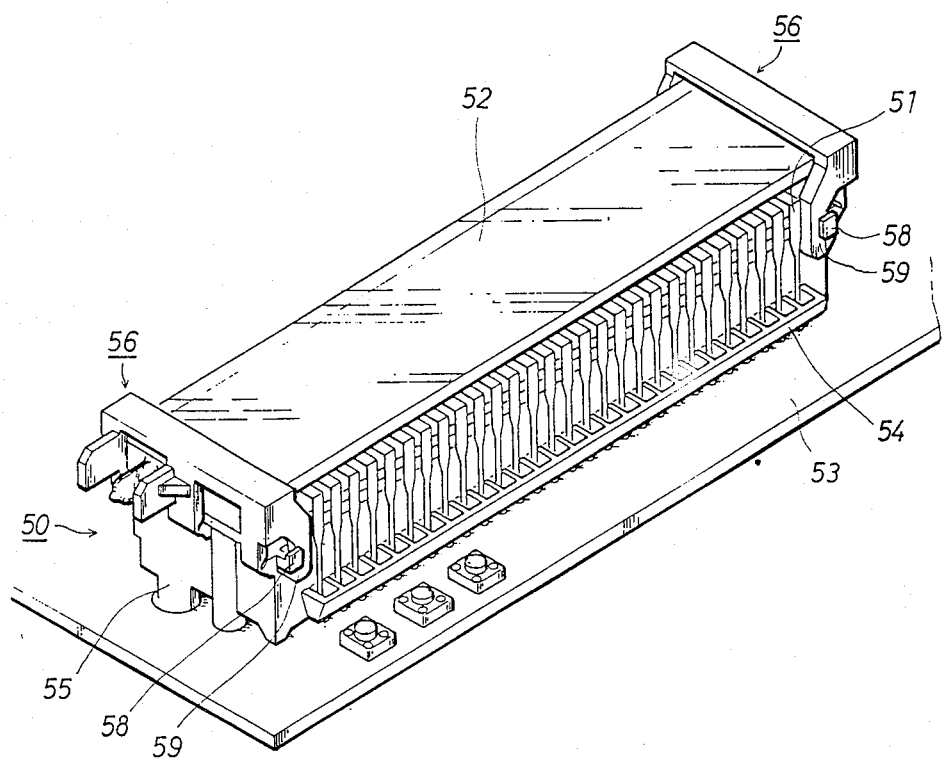

As shown in the figures, holes 16 through 18 are formed at the center of the plate-like rest 3, and elastic supporting members 20 thru 23 are formed at both longitudinal ends of the rest in such a manner that one end of each of the supporting members is fixed to the plate-like rest. The holes 16 through 18 provide the following functions. For one thing, the holes help the radiation of the electronic display tube 2. For another, there is no need to demount the fixation device for repairing or checking the electronic display in the condition that the display is fixed on the circuit board 6 as shown in FIG. 11. For example, it is possible to enlarge the size of the hole as indicated by a double dotted chain in FIG. 1. When the electronic display tube 2 is put on the plate-like rest 3 as shown in FIG. 9, the elastic supporting members 20 through 23 press the surface of the electronic display 2 against the upper wall 5a (4a) of the holding member 5 (4), and make the surface of the display tube parallel to the plate-like rest 3. Thereby, inclined setting or loose attachment of the electronic display can be prevented.

Furthermore, elastic engaging members 24 and 25 are formed in right-hand and left-hand of the transverse end surface of the plate-like rest where the hinges 12 and 13 is formed. When the electronic display tube 2 is put on the rest 3 as shown in FIG. 9, the elastic engaging members 24 and 25 function to press the transverse end surface of the display tube 2 with terminals against the projections 5e (4e) of the holding members 5 (4) so as to provide a standard parallel surface against the plate-like rest and to prevent loose fitting of the electronic display tube 2. Because of the abovementioned reasons, the electronic display tube 2 can be firmly fixed even though the size of the display is imprecise.

At the left-hand longitudinal end of the plate-like rest 3, a box-shaped protecting frame 27 is formed to protect the glass-made projection 2a which is utilized when gas is charged into the display tube. When the display tube 2 is attached to the fixation device, the glass-made projection 2a can be protected by the frame 27 so as not to be broken.

The fixing members 7 and 8 are formed on the back surface of the plate-like rest 3 for fixing the rest 3 to the circuit board. The fixing members 7 and 8 are composed of shanks 7a and 8a, and check elements 7b and 8b extending from each end of the shanks to prevent the shanks from disengaging from the attachment holes of the circuit board 6. Bar-type projections 30 and 31 are also formed on the back surface of the plate-like rest 3, which are inserted into the insertion holes of the circuit board 6. They prevent the loose fitting of the plate-like rest and position the fixation device 1 on the circuit board 6.

By utilizing the fixation device of this embodiment as described hereinbefore, the electronic display tube 2 can be firmly fixed on the plate-like rest 3 by setting the display tube 2 on the rest 3, then pivotally turning the holding members 4 and 5 to be closed, and inserting the engaging projections 14 and 15 into the insertion holes 4c and 5c. By simply pulling out the end of the engaging parts 4d and 5d of the holding members 4 and 5 from the engaging projections 14 and 15, the electronic display 2 can be easily demounted from the platelike rest 3. Since the holding members 4 and 5 can pivot in the vertical direction of the platelike rest 3 in this embodiment, the allowance of the width is not required. Therefore, even a large-size electronic display, e.g., the display of a size as same as the circuit board can be easily attached and demounted.

Figure 10:
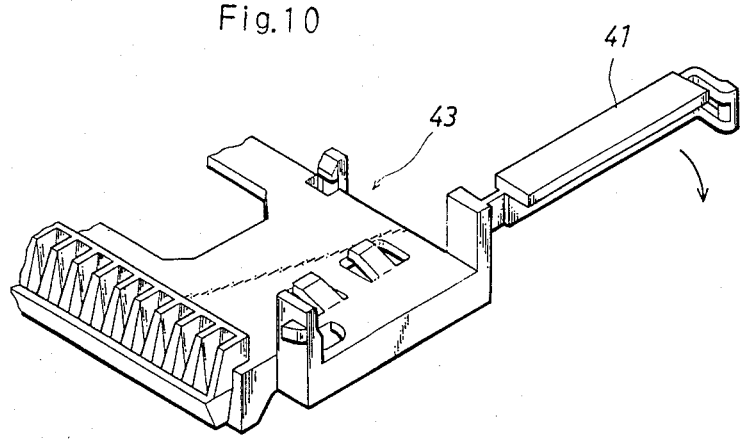
FIG. 10 is a partially cut-away view in perspective of a fixation device of another embodiment.

As shown in FIG. 10, it is possible to form the holding member 41 at the transverse end of the plate-like rest 43 so as to pivot in a horizontal direction, while in this embodiment the holding members 4 and 5 pivot in a vertical direction.

What is claimed is:

1. An electronic display fixation device comprising:
 a plate-like rest having front and back surfaces and having two opposed edges at opposite sides thereof;
 at least two holding members, each of said holding members being connected to only one of said opposed edges by a hinge and extending substantially transverse to said one edge such that said holding member may pivot via said hinge, each of said holding members having a length sufficient such that a free end thereof can reach the other of said edges upon a pivoting of said holding member to a retaining position, whereby said holding member extends across said plate-like rest to hold an electronic display mounted on the front surface thereof;

engaging means, formed only on the other of said opposing edges at positions corresponding to said free ends of said holding members in said retaining position, for engaging and holding said free ends; and fixing means extending from said back surface for fixing said device to a circuit board.

2. The fixation device as claimed in claim 1 including insertion holes formed at said free ends of said holding members and engagable with said engaging means when said holding members are in said retaining position.

3. The fixation device as claimed in claim 2 wherein said holding members are mounted on said hinges so as to swing vertically on said rest.

4. The fixation device as claimed in claim 3 wherein said holding members include upper walls and side walls.

5. The fixation device as claimed in claim 1, including a box shaped protecting frame extending from said plate-like rest at a position surrounding a gas charging projection in an electronic display mounted on said device.

6. The fixation device as claimed in claim 4, including a box shaped protecting frame extending from said plate-like rest at a position surrounding a gas charging projection in an electronic display mounted on said device.

7. The fixation device as claimed in claim 1 wherein said holding members are flat and uncurved along the lengths thereof.

8. The fixation device as claimed in claim 1 wherein said holding members are mounted on said hinges so as to swing vertically on said rest.

9. The fixation device as claimed in claim 1, wherein said holding members are are mounted on said hinges so as to swing horizontally on said rest.

10. The fixation device as claimed in claim 1 wherein said holding members include upper walls and side walls.

* * * * *